United States Patent [19]

Rosen

[11] Patent Number: 5,196,397
[45] Date of Patent: Mar. 23, 1993

[54] HIGH TEMPERATURE SUPERCONDUCTING CERAMIC COPPER OXIDE PEROVSKITE WITH ENHANCED UPPER CRITICAL FIELD ($H_{c2}$)

[75] Inventor: Carol Z. Rosen, Teaneck, N.J.

[73] Assignee: GEC-Marconi Electronics Systems Corp., Wayne, N.J.

[21] Appl. No.: 790,434

[22] Filed: Nov. 12, 1991

Related U.S. Application Data

[62] Division of Ser. No. 648,546, Jan. 30, 1991, Pat. No. 5,093,310.

[51] Int. Cl.$^5$ .............................. H01B 1/00; B05D 3/06
[52] U.S. Cl. .......................................... 505/1; 505/730; 505/780; 427/62; 427/36; 423/593; 423/604
[58] Field of Search .................... 505/1, 780, 730; 427/62, 36; 423/593, 604; 250/492.1

[56] References Cited

PUBLICATIONS

Kato et al, "Radiation effect of $YBa_2Cu_3O_{7-y}$ irradiated by $\gamma$-Rays and 15 Mev Neutrons", Jpn. J. Appl. Phys. 27(11) Nov. 1988, L2097–2099.

Bohandy et al, "Gamma Radiation Resistance of the high Tc Superconductor $YBa_2Cu_3O_{7-\delta}$", Apply. Phys. Let. 15(25) Dec. 1987, pp. 2161–2163.

Roas et al, "Irradiation-induced enhancement of the critical current density of epitaxial $YBa_2Cu_3O_{7-x}$ thin films", Appl. Phys. Lett. 54(11) Mar. 1989 pp. 1051–1053.

Shiraishi et al, "Ion irradiation effect on $Ba_2YCu_3O_7$ superconductor" Jpn. J. Apply. Phys. 28(3) Mar. 1989 pp. L409–411.

Van Dover et al, "Critical currents near $10^6$ A cm$^{-2}$ at 77K in neutron-irradiated single-crystal $YBa_2Cu_3O_7$", Nature, vol. 342 Nov. 1989 pp. 55–57.

Primary Examiner—Shrive Beck
Assistant Examiner—Roy V. King

[57] ABSTRACT

A high temperature superconducting ceramic copper oxide perovskite with enhanced upper critical field ($H_{c2}$) and increased current carrying capacity caused by exposure to gamma radiation.

3 Claims, 5 Drawing Sheets

DATA AND $H_{C2}(0)$ FOR $D_0$, $D_{10}$, AND $D_{100}$ $D_0$
$T_C = 96°K$

| $T(°K)$ | $H_{C2}(T)$ |
|---|---|
| 65 | 10 |
| 68 | 9 |
| 70 | 10 |
| 75 | 2.4 |
| 75 | 8 |
| 85 | 3.7 |
| 90 | 2.7 |

$H_{C2}(0) = 18.81109$ $D_{10}$
$T_C = 96°K$

| $T(°K)$ | $H_{C2}(T)$ |
|---|---|
| 68 | 9.5 |
| 70 | 8.5 |
| 75 | 6.7 |
| 75 | 7.7 |
| 75 | 9 |
| 80 | 8.5 |
| 85 | 5 |
| 87.5 | 3.2 |
| 90 | 2.7 |
| 95 | 1.2 |

$H_{C2}(0) = 20.70725$ $D_{100}$
$T_C = 96°K$

| $T(°K)$ | $H_{C2}(T)$ |
|---|---|
| 70 | 9 |
| 75 | 8.5 |

LINEAR REGRESSION ANALYSIS OF PARABOLIC $H_{C2}(T)$ LAW

DEFINITIONS: $G = 1/H_{C2}(0)$    $t = (T/T_C)$

PARABOLIC LAW: $1 - G \, H_{C2}(T) = t^2$

LET $S = \sum_{\text{ALL DATA POINTS}} (1 - G \, H_{C2}(T) - t^2)^2$ $H_{C2}(0)$ IS DETERMINED BY MINIMIZING S WITH RESPECT TO VARIATION OF G.

$$\frac{dS}{dG} = 0 \text{ WHEN } G = \frac{\sum (1 - t_i^2) \, H_{C2}(T_i)}{\sum H_{C2}(T_i)^2} = \frac{1}{H_{C2}(0)}$$

IN THE LAST EQUATION THE SUMMATION INDEX I, IN EACH SUM, RUNS THROUGH THE DATA POINTS.

THE FOLLOWING TABLE SUMMARIZES THE RESULTS OF THIS ANALYSIS ON THE DATA GIVEN IN FIG. 4

| D | $H_{C2}(0)$ IN TESLA |
|---|---|
| $D_0$ | 18.81 |
| $D_{10}$ | 20.71 |
| $D_{100}$ | 20.36 |

FIG. 5

HIGH TEMPERATURE SUPERCONDUCTING CERAMIC COPPER OXIDE PEROVSKITE WITH ENHANCED UPPER CRITICAL FIELD ($H_{c2}$)

This application is a division of application Ser. No. 07/648,546, filed Jan. 30, 1991, now U.S. Pat. No. 5,093,310.

BACKGROUND OF THE INVENTION

This invention relates to high temperature superconductors and, more particularly, to enhancement of the upper critical field and current carrying capacity of such materials.

High temperature superconducting ceramics (HTSC) have been discovered in recent years. A typical material such as $YBa_2Cu_3O_7$ (YBCO) is a member of this perovskite family of copper based oxides that combine easily with alkaline and rare earth ions to form these HTSC. These materials hold great promise for industrial and military applications. For optimum utility they should have a current carrying capacity greater than $10^9$ amperes/meter$^2$. This physical property requires the HTSC to have high critical current density ($J_c$) and high upper critical magnetic field ($H_{c2}$).

It is known that such desirable characteristics can be achieved in Type II superconductors which exhibit flux pinning, that is, magnetic flux generated from current flow is fixed in place in the body of the superconductor. Also, in an increasing magnetic field, the entry into the HTSC of significant amounts of flux may not occur because of pinning effects until a field several times the lower critical field ($H_{c1}$) has been applied, and when the flux does penetrate, it does so slowly (with respect to the size of the magnetic field) and penetration is incomplete until the applied field equals $H_{c2}$.

Investigative attempts are currently underway to enhance flux pinning in HTSC. A first method involves shock-compaction and is described in "Superconducting and Microstructural Properties of Shock-Impacted High-TC Oxide Powders"—C. L. Seaman, M. B. Maple, U. California, San Diego; W. J. Nellis, J. B. Holt, M. Kamegai—Lawrence Livermore Laboratory, presented at 1989 Topical Conference on Shock Compression of Condensed Matter, Alberquerque, N.M., Aug. 14-17, 1989. A second method involves alteration of the width of the grain boundary layer by chemical means and is described in "Grain Boundaries and Critical Current in Type II Superconducters", A. DasGupta, U.S. Department of Energy, Chicago Operations Office, 9800 South Cass Avenue, Argonne, Ill. 60439, presented at The Second International Ceramic Science and Technology Congress and The American Ceramic Society's Electronics Division Meeting, Orlando, Fla., Nov. 12-15, 1990. However, neither of these attempts has achieved entirely satisfactory results.

U.S. Pat. No. 3,149,232 of Jaffe et al discloses a method of irradiating piezoelectric ceramic materials with gamma radiation to improve some of their electrical and mechanical properties. However, there is no suggestion by Jaffe et al that gamma radiation could be used to enhance the uppper critical magnetic field and current carrying capacity of superconducting materials, particularly high temperature superconducting ceramic materials such as copper oxide perovskites.

It is therefore a primary object of this invention to treat HTSC to enhance the upper critical magnetic field ($H_{c2}$) therein.

SUMMARY OF THE INVENTION

The foregoing, and additional, objects are attained in accordance with the principles of the invention by treating HTSC to exhibit enhanced upper critical magnetic fields ($H_{c2}$) by exposure of the ceramic material to gamma radiation.

BRIEF DESCRIPTION OF THE DRAWINGS

The principles of the invention will be more readily apparent upon reading the following description in conjunction with the drawings which represent experimental results and wherein:

FIG. 4 gives the $H_{c2}(0)$ values calculated for the $D_o$, $D_{10}$, $D_{100}$ data for $T_c=96$ degrees Kelvin; and FIG. 5 presents the linear regression analysis for $H_{c2}(0)$ from the parabolic $H_{c2}(T)$ law.

DETAILED DESCRIPTION OF THE INVENTION

Figure 1:
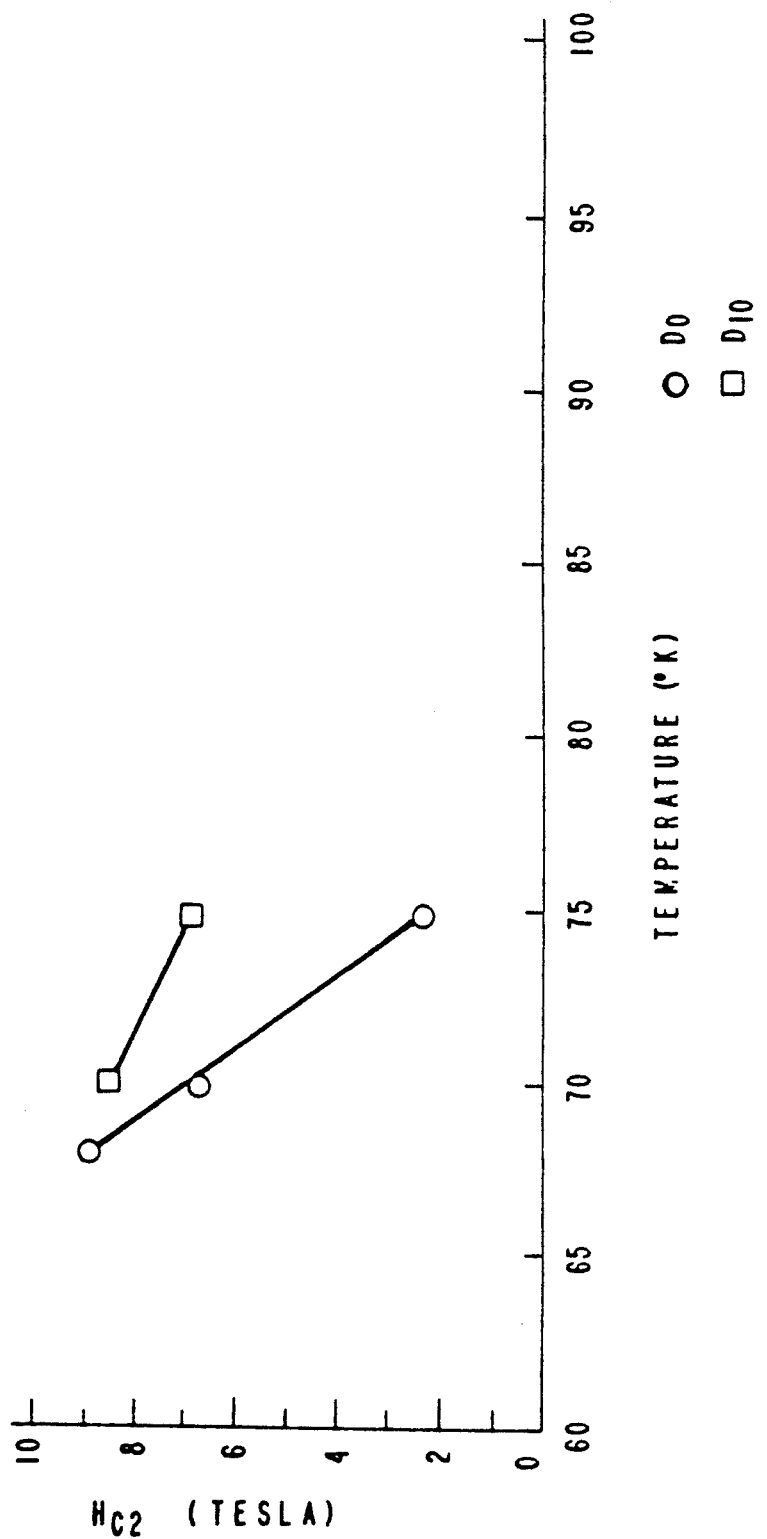
FIG. 1 is a plot of $H_{c2}$ as a function of temperature before ($D_0$) and after ($D_{10}$) gamma radiation of YBCO.

A possible microscopic mechanism by which the invention is effective is that the treatment given to the HTSC according to the invention provides such defect formation and modifications in the lattice structure and the grain boundaries of the HTSC material that enhanced pinning of the flux lines is achieved. The current generating the magnetic flux lines experiences a Lorentz force whenever a current flows in these Type II HTSC, $F_{L(vol)}=J \times B$, where $F_{L(vol)}$ is the Lorentz force per unit volume, J is the current density of the flow, and B is the magnetic flux density. The current itself generates some or all of the magnetic field. According to Ampere's law there is always some magnetic field generated by the current. High critical field is connected with high critical current via the following arguments about movement of flux lines. This is often described by stating that there is a force on the flux lines. This force acts in a direction normal to both the current and the flux lines. Unless the flux lines are prevented from moving, their motion will be in the direction of this Lorentz force.

Flux lines can be immobilized, or "pinned", when they interact with intrinsic or extrinsic microstructural features of the superconductor. This interaction exerts a pinning force per unit volume, $F_{P(vol)}$ on the flux lines opposing the Lorentz force. The maximum $F_{L(vol)}$ the material can sustain is equal to the $F_{P(vol)}$. When $F_{L(vol)}$ is larger than this, the lines will move, then $J_c \times B = -F_{P(vol)}$.

The velocity of the flux line (v) and the flux density (B) give rise to an induced electric field, $E_{ind}=(-v \times B)$, which acts as a resistive voltage, $E_{ind}=(J_{ind}/\sigma)$ (where $\sigma$=normal electric conductivity) and power is dissipated. The induced resistance approaches the normal state resistance as B approaches $\mu_o H_{c2}$, where $\mu_o$ is the permeability of free space. The critical current density ($J_c$) is that current density which just produces any voltage across the conductor, and hence is that current density which first causes the flux lines to move, thereby destroying superconductivity. If the motion of flux lines is inhibited (pinned) then high values of critical current densities and upper critical fields $H_{c2}$ can be attained.

The principles and the method of the invention are applicable to substantially all members of the HTSC perovskite family and other Type II superconducting materials in which gamma radiation will cause substantial pinning of flux lines. According to the invention, the HTSC, which may be of any suitable shape and size consistent with the apparatus in which it is treated, is exposed to gamma radiation at an appropriate dosage and dose rate. In a first procedure, YBCO specimens were exposed to a cobalt 60 source to a dosage of 10 million rads ($D_{10}$) at a dose rate $R_A$ equal to 3 million rads per hour. In a second procedure, YBCO specimens were exposed to a cobalt 60 source to a dosage of 100 million rads ($D_{100}$) at a dose rate $R_A$ equal to 3 million rads per hour.

This treatment of HTSC forms pinning centers of such density that magnetic flux lines are inhibited from moving transversely to the current. Therefore, no electric field is induced and no energy is dissipated by Joule heating.

After the $D_{10}$ radiation process was completed, the upper critical field, $H_{c2}$ was measured and a value of 6.8 Tesla at 75 degrees Kelvin was achieved on the first test. This was three times the 2.3 Tesla value obtained for no gamma exposure ($D_0$). It is understood that the greater the $H_{c2}$ value for a given temperature, the greater the critical current density.

Those skilled in the art will appreciate that variation in the gamma radiation dosage and rate could very well lead to an optimization of this enhancement effect.

FIG. 1 presents two sets of measurements (obtained January 1990) of the upper critical field, $H_{c2}$ of YBCO before ($D_0$) and after ($D_{10}$) exposure to gamma radiation. The $H_{c2}$ values at $D_0$ were 8.9, 6.7, and 2.3 Tesla for temperatures of 68, 70 and 75 degrees Kelvin, respectively. Qualitatively, one can see that the irradiation increased $H_{c2}$ and that $H_{c2}$ decreases with increasing temperature. Enhancement of $H_{c2}$ by gamma radiation treatment implies that $J_c$ values will also be increased.

Figure 2:
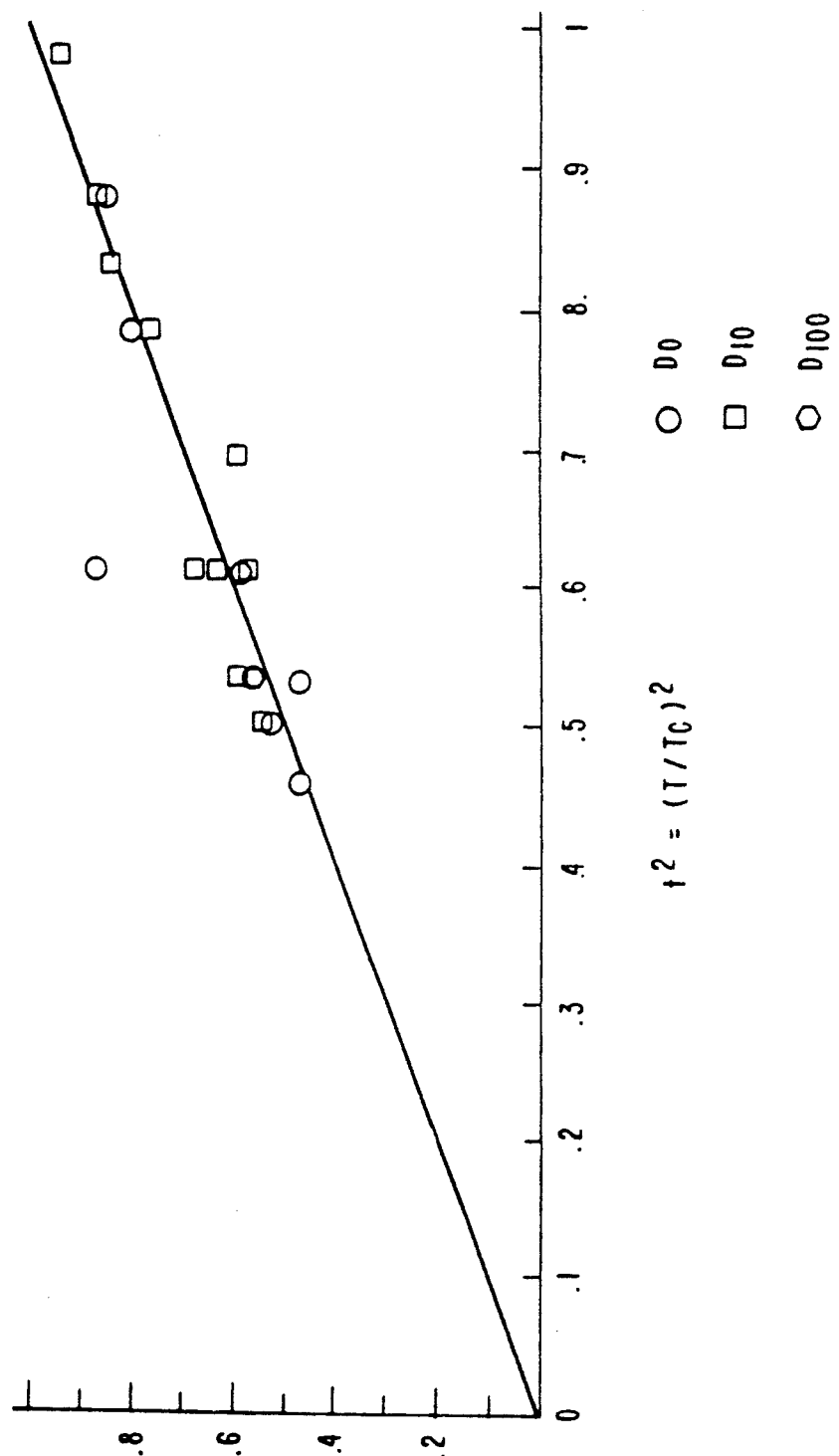
FIG. 2 is a plot of $[H_{c2}(0)-H_{c2}(T)]/H_{c2}(0)$ versus $t^2$ for YBCO at ($D_o$, $D_{10}$, $D_{100}$) gamma exposures, where $t=T/T_c$, $T_c$ is the superconducting transition temperature and $H_{c2}(0)$, the upper critical field at 0° Kelvin, is obtained by regression analysis, assuming the relation $H_{c2}(T)=H_{c2}(0)(1-t^2)$.

FIG. 2 presents a plot of data taken Feb. 2 and 24, 1990, and summarized in FIG. 4, superimposed on the well approximated parabolic law $H_{c2}(T) = H_{c2}(0)[1-(T/T_c)^2]$. Linear regression analysis (see FIG. 5) is used to obtain $H_{c2}(0)$ for the three cases ($D_0$, $D_{10}$ and $D_{100}$). The data are fit to a straight line plot of $[H_{c2}(0)-H_{c2}(T)]/H_{c2}(0)$ versus $(T/T_{c2})^2$, with $T_c = 96$ degrees Kelvin. A value for $H_{c2}(0)$ is obtained from this parabolic equation and this least squares fit to the data. The results presented in FIG. 4 show that $H_{c2}(0)$ for $D_{100}$ and $D_{10}$ are greater than the $H_{c2}(0)$ value for $E_0$.

From the conformance of the data to this thermodynamic law, we take the 11% enhancement shown for the D10 and $D_{100}$ cases to conclude that $H_{c2}(0)$ is increased on exposure of the YBCO specimens to gamma irradiation.

Figure 3:
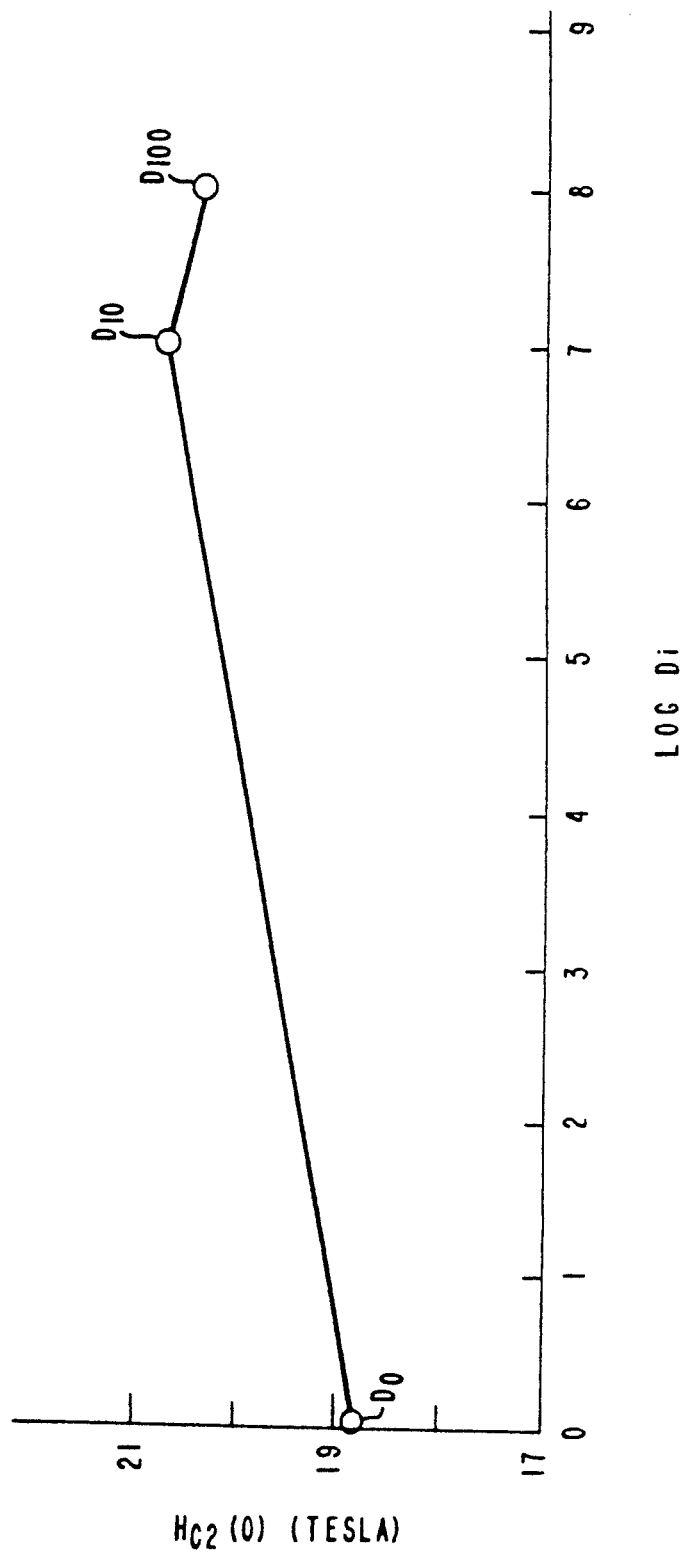
FIG. 3 is a plot of $H_{c2}(0)$ versus log $D_i$.

From the $H_{c2}(0)$ versus log $D_i$ ($D_i$=dosage) curves given in FIG. 3 we see, again, an enhancement in $H_{c2}(0)$ as a function of gamma dosage. The points are connected by a line to guide the eye. There is no implication that the data between the points would follow that line. It is expected that optimization values exist within or outside the range.

These $H_{c2}(0)$ results based on the use of the parabolic law and regression analysis (shown in FIG. 5) permit the assertion that for any value of T between 0 degrees Kelvin and $T_c$ an enhancement of $H_{c2}(T)$ follows. Hence, irradiation causes an increase of $H_{c2}(T)$ which implies an increase in $J_c$.

Accordingly, there has been described a method for enhancing the upper critical field ($H_{c2}$) in YBCO and similar HTSC. This method also enhances the current carrying capacity, the critical current density, and the ability to withstand high magnetic fields. It will be clear to those skilled in the art that various modifications and adaptations to the disclosed method are possible, and it is intended that this invention be limited only by the scope of the appended claims.

I claim:

1. A Type II superconducting material exposed to gamma radiation to increase the current carrying capacity of the material and to enhance the upper critical field ($H_{c2}$) of the material; wherein the exposure to the gamma radiation is in the range of about $10^7$ to about $10^8$ rads at a dose rate of about 3 million rads per hour.

2. The material according to claim 1 wherein the Type II material is selected from the perovskite family of high temperature superconducting ceramic copper oxides.

3. The material according to claim 2 wherein the high temperature superconducting ceramic copper oxide is $YBa_2Cu_3O_7$.

* * * * *